(12) United States Patent
Wunderlich (10) Patent No.: US 11,991,843 B2
(45) Date of Patent: May 21, 2024

(54) APPARATUS AND PROCESS VALVE ASSEMBLY

(71) Applicant: Festo SE & Co. KG, Esslingen (DE)

(72) Inventor: Steffen Wunderlich, Aichtal (DE)

(73) Assignee: Festo SE & Co. KG, Esslingen (DE)

( * ) Notice: Subject to any disclaimer, the term of this patent is extended or adjusted under 35 U.S.C. 154(b) by 717 days.

(21) Appl. No.: 17/057,300

(22) PCT Filed: May 23, 2018

(86) PCT No.: PCT/EP2018/063482
§ 371 (c)(1),
(2) Date: Nov. 20, 2020

(87) PCT Pub. No.: WO2019/223860
PCT Pub. Date: Nov. 28, 2019

(65) Prior Publication Data
US 2021/0195771 A1 Jun. 24, 2021

(51) Int. Cl.
*H05K 5/02* (2006.01)
*F15B 20/00* (2006.01)
*H05K 7/14* (2006.01)

(52) U.S. Cl.
CPC ............. *H05K 5/0213* (2013.01); *H05K 5/02* (2013.01); *H05K 5/0217* (2013.01); *H05K 7/1427* (2013.01); *F15B 20/00* (2013.01)

(58) Field of Classification Search
CPC . F15B 20/00; H05K 5/00; H05K 5/02; H05K 5/0217; H05K 7/14; H05K 7/1427;
(Continued)

(56) References Cited

U.S. PATENT DOCUMENTS

| | | | |
|---|---|---|---|
| 6,992,467 B1* | 1/2006 | Fey | H02H 9/025 |
| | | | 323/299 |
| 7,647,940 B2* | 1/2010 | Minervini | F16K 37/0041 |
| | | | 137/454.2 |

(Continued)

FOREIGN PATENT DOCUMENTS

| | | |
|---|---|---|
| CN | 104718806 A | 6/2015 |
| DE | 102010030924 A1 | 12/2011 |

(Continued)

OTHER PUBLICATIONS

Chinese Office Action dated Aug. 12, 2021.

*Primary Examiner* — Anthony R Jimenez
(74) *Attorney, Agent, or Firm* — Hoffmann & Baron, LLP (57) ABSTRACT

An apparatus for process automation for use in an area where there is a risk of explosion and in which dusts may occur, including a wall structure serving as a housing of the apparatus and having a first wall structure section defining a first housing inner area and a second wall structure section defining a second housing inner area separated from the first housing inner area, wherein a first circuit arrangement is arranged in the first housing inner area and the first housing inner area is dust-tightly enclosed by the first wall structure section so that the dusts cannot penetrate into the first housing inner area and the explosion safety of the first housing inner area is ensured by the dust-tight enclosure, one or more electrical circuits being arranged in the second housing inner area and all the electrical circuits arranged in the second inner area forming an altogether intrinsically safe second circuit arrangement.

18 Claims, 2 Drawing Sheets

(58) Field of Classification Search
CPC .......... H05K 5/0213; H05K 7/00; H05K 7/02;
H05K 7/1402; H05K 7/1422; H05K
7/1438; H05K 9/00; H05K 9/007; H05K
9/0022; H05K 9/0067; H05K 5/0004;
H05K 5/0026; H05K 5/0034; H05K
5/0039; H05K 5/0047; H05K 5/0056;
H05K 5/0095; H05K 5/0209; H05K
5/0214; H05K 5/0256; H05K 5/0286;
H05K 5/06; H05K 5/063; H05K 5/069;
H01H 9/04; H01H 9/042; H01H 9/045;
H01H 9/046; H01H 1/64; H01H 1/645;
H01H 1/66; H01H 39/00; H01H 85/0082
USPC ..................................................... 200/302.1
See application file for complete search history.

(56) References Cited

U.S. PATENT DOCUMENTS

| | | | |
|---|---|---|---|
| 2015/0085449 A1 | 3/2015 | Norman et al. | |
| 2015/0230357 A1* | 8/2015 | Fink ....................... | H05K 5/069 |
| | | | 361/809 |

FOREIGN PATENT DOCUMENTS

| | | |
|---|---|---|
| DE | 102012108414 A1 | 3/2014 |
| EP | 0945714 A1 | 9/1999 |
| WO | 2009/009569 A1 | 1/2009 |

* cited by examiner

APPARATUS AND PROCESS VALVE ASSEMBLY

This application claims priority based on an International Application filed under the Patent Cooperation Treaty, PCT/EP2018/063482, filed on May 23, 2018.

BACKGROUND OF THE INVENTION

The invention relates to an apparatus, in particular a control head, positioner and/or sensor controller, for process automation for use in an environment where there is a risk of explosion and where dusts may occur. The dusts mentioned at this point and in the following are especially electrically conductive dusts. The apparatus is an electrical apparatus.

The apparatus includes a wall structure that serves as the housing of the apparatus and includes a first wall structure section that defines a first housing inner area. The wall structure further comprises a second wall structure section defining a second housing inner area separate from the first housing inner area. A first circuit arrangement is arranged in the first housing inner area and the first housing inner area is dust-tightly enclosed by the first wall structure section, so that the dusts cannot penetrate into the first housing inner area and the explosion safety of the first housing inner area is ensured by the dust-tight enclosure.

From the prior art, apparatuses with a sealed housing inner area are known. In WO 2009/09569 A1, for example, a positioner is described which has a waterproof housing to protect sensitive electrical components.

Furthermore, U.S. Pat. No. 7,647,940 B2 describes a valve controller with separate chambers for mechanical and electrical components.

For use in an environment where there is a risk of explosion and where dusts, especially electrically conductive dusts, may occur, the object is to design the apparatus in such a way that explosion safety is ensured without restricting the function and/or adaptation possibilities of the apparatus too much.

SUMMARY OF THE INVENTION

This object is solved by an apparatus according to claim 1: One or more electrical circuits are arranged in the second inner area of the apparatus and all electrical circuits arranged in the second inner area form an overall intrinsically safe second circuit arrangement, so that even if the dusts penetrate into the second inner area of the apparatus, no explosion-initiating heating and/or sparking is possible by the second circuit arrangement and the explosion safety of the second inner area of the apparatus is ensured by the overall intrinsically safe design of the second circuit arrangement.

This results in a device divided into two housing inner areas, with a different type of ignition protection used in each inner area. In the first housing inner area, explosion protection is achieved in particular by the ignition protection type "protection by enclosure Ex t" and in the second housing inner area by an altogether intrinsically safe design of the first circuit arrangement. An altogether intrinsically safe design can also be described as single circuit intrinsic safety.

Since the first housing inner area is sealed dust-tight, the first circuit arrangement does not necessarily have to be designed to be altogether intrinsically safe; i.e. the first circuit arrangement can also be designed in such a way that there is a risk of an explosion-triggering short circuit if dust penetrates. In the case of the not altogether intrinsically safe design, a multi-circuit intrinsic safety can be present, i.e. a plurality of intrinsically safe circuits are present. A design that is not altogether intrinsically safe can also be described as existing multi-circuit intrinsic safety. Consequently, the requirements for the first circuit arrangement accommodated in the first housing inner area are lower, so that the first circuit arrangement can also include very complex circuits. In particular, the first circuit arrangement can also include safety barriers, for example a diode and/or a resistor connected as a safety barrier.

The requirements for the second circuit arrangement, which is located in the second housing inner area, are higher—here, all circuits must be intrinsically safe as a whole, i.e. such that no explosion-causing heating and/or sparking is possible even if dust is deposited. Accordingly, only simple circuits, such as analog-digital converters or digital-analog converters, which are also intrinsically safe as a whole, are preferably accommodated in the second inner area of the housing.

The second inner area of the housing does not have to be dust-tight and/or verified and/or certified for its dust-tightness, and, expediently, it is not. This makes it possible to modify and/or adapt the second wall structure section without major effort; after all, no dust-tightness needs to be guaranteed for the second inner area of the housing and no verification/certification is required in this respect either, so that an adaptation does not involve any major effort.

This means that explosion protection can be guaranteed with the inventive apparatus without limiting the function and/or adaptation possibilities too much.

Furthermore, according to the invention, an apparatus is provided, in particular a control head, positioner and/or sensor controller, for process automation for use in an area in which there is a risk of explosion and in which dusts can occur, the apparatus comprising a wall structure serving as housing of the apparatus and comprising a first wall structure section defining a first housing inner area and a second wall structure section defining a second housing inner area separated from the first housing inner area, wherein a first circuit arrangement is arranged in the first housing inner area and the first housing inner area is enclosed in a dust-tight manner by the first wall structure section, so that the dusts cannot penetrate into the first housing inner area and the dust-tight enclosure ensures the explosion safety of the first housing inner area, the apparatus having a first circuit board which is part of the first wall structure section and the second wall structure section and separates the first housing inner area from the second housing inner area in a dust-tight manner.

BRIEF DESCRIPTION OF THE DRAWINGS

Below, exemplary details and embodiments are explained with reference to the figures.

DETAILED DESCRIPTION

Figure 1:
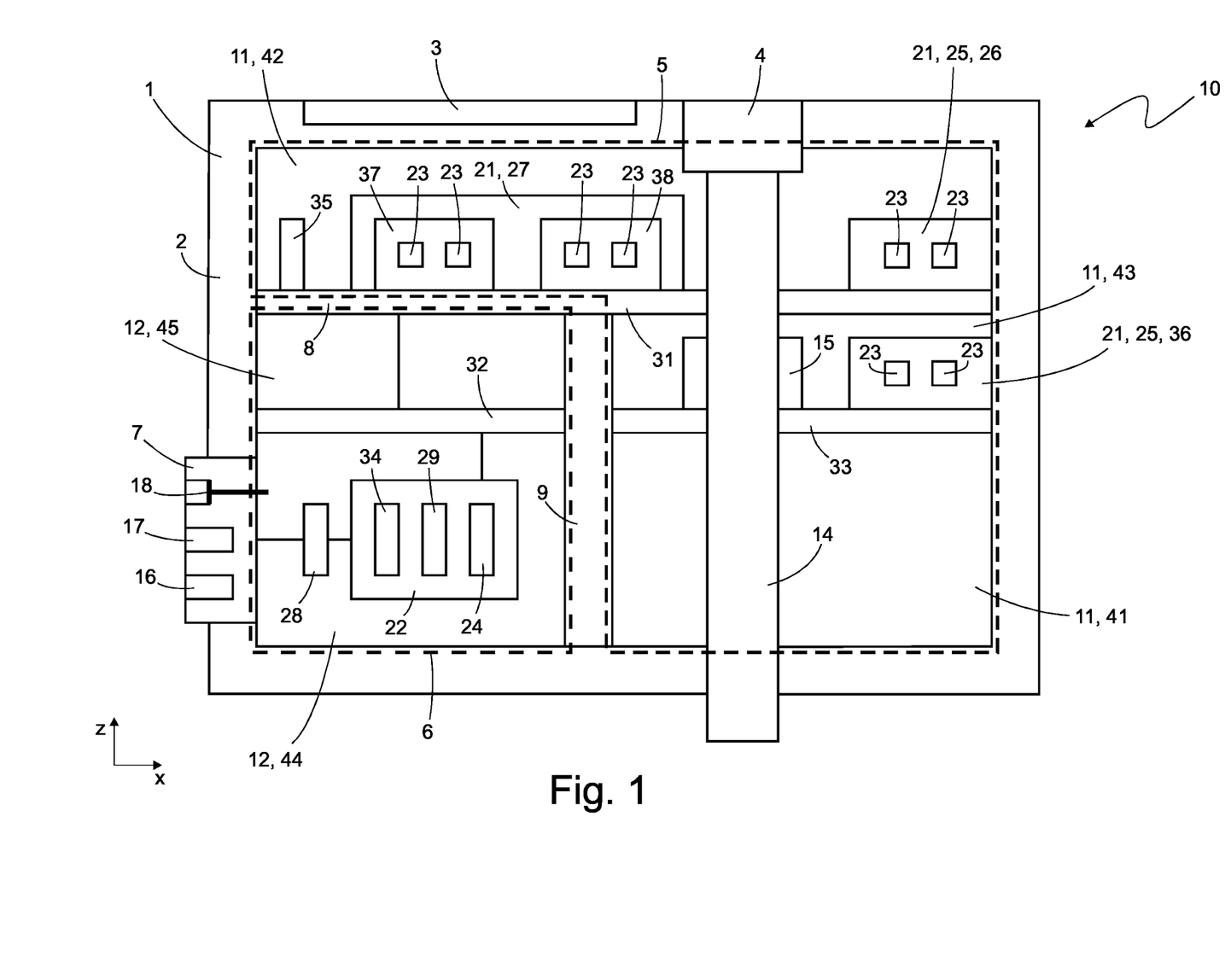
FIG. 1 shows a schematic representation of an apparatus.

FIG. 1 shows an apparatus 10, which here is exemplarily designed as a control head and/or positioner, preferably for controlling a valve drive 20 and/or a valve fitting 30. Alternatively, the apparatus 10 can also be designed differently, for example, the apparatus 10 can also be a sensor controller; i.e. a device with which sensors are controlled and/or read out. Basically, the apparatus 10 is an electrical device for process automation, which is used in an area where there is a risk of explosion and where dusts, especially electrically conductive dusts, can occur.

The apparatus 10 comprises a wall structure 1. The wall structure 1 serves as housing for the apparatus 10. The wall structure 1 has a first wall structure section 5 and a second wall structure section 6. The courses of the two wall structure sections 5 and 6 are marked with dashed lines in FIG. 1.

The first wall structure section 5 defines a first inner area 11 and the second wall structure section 6 defines a second inner area 12. The first inner area 11 and the second inner area 12 are separated from each other. In the first inner area 11 a first circuit arrangement 21 is located and in the second inner area 12 a second circuit arrangement 22 is located.

Explosion safety in the two housing inner areas 11 and 12 is respectively achieved in a different way:

In the first housing inner area 11, explosion safety is ensured by the first housing inner area 11 being dust-tightly enclosed by the first wall structure section 5, so that the dusts cannot penetrate into the first housing inner area 11.

This prevents the dusts from penetrating into the first housing inner area 11 and causing a short circuit in the first circuit arrangement 21, which short circuit could lead to an explosion-causing spark and/or explosion-causing heating.

In the first housing inner area 11, explosion safety is therefore achieved by means of a dust-tight enclosure.

In the second housing inner area 12, however, explosion safety is achieved by an altogether intrinsically safe design of the second circuit arrangement 22. The second circuit arrangement 22 is formed by all electrical circuits 24 in the second inner area 12. Due to the altogether intrinsically safe design of the second circuit arrangement 22, no explosion-causing heating and/or sparking is possible by the second circuit arrangement 22, even if the dusts penetrate into the second housing inner area 12. Thus, the explosion safety is achieved in the second inner area of the housing by the altogether intrinsically safe design of the second circuit arrangement 22.

The subdivision into the two housing inner areas 11, 12 and the different guarantee of explosion safety in the two housing inner areas 11, 12 is advantageous, because the wall structure 1 or the housing of the apparatus can be adapted more simply.

Only a part of the wall structure 1—namely the first wall structure section 5—must be dust-tight, while the second wall structure section 6 does not necessarily have to be dust-tight. In particular, attachment elements, such as connection elements, which are part of the second wall structure section 6, can thus be easily adapted, modified or exchanged without having to achieve, verify and/or certify the dust-tightness of the second housing inner area 12.

Complex circuits, for which an altogether intrinsically safe design would be very costly, can be accommodated in the first housing inner area 11, where they are protected from the electrically conductive dust by the first wall structure section 5 and therefore do not necessarily have to be designed to be intrinsically safe as a whole.

Exemplary details of the apparatus 10 are explained below.

First, regarding the basic structure and the basic function of the apparatus 10:

The apparatus 10 is in particular an electrical and/or fluidic device that can be handled as a physical unit and has the housing 2, which is the outer wall of the apparatus 10. The housing 2 can be a single piece or can consist of several sections, in which case expediently all sections of the housing 2 are firmly connected to each other. The housing 2 is formed by at least a part of the wall structure 1—in the example shown, by the outer walls of the wall structure 1. As an example, the housing 2 has a cuboid basic shape.

The direction of the width of the apparatus 10 shall also be called x-direction and the direction of the height of the apparatus 10 shall be called z-direction. The direction of the depth (which is perpendicular to the drawing plane) shall be called y-direction. The x-direction, y-direction and z-direction are orthogonal to each other.

The apparatus 10 is expediently designed to be mounted on the valve drive 20 and/or the valve fitting 30. For this purpose, an mechanical interface may be provided on the bottom of the housing 2 (not shown in FIG. 1).

Figure 2:
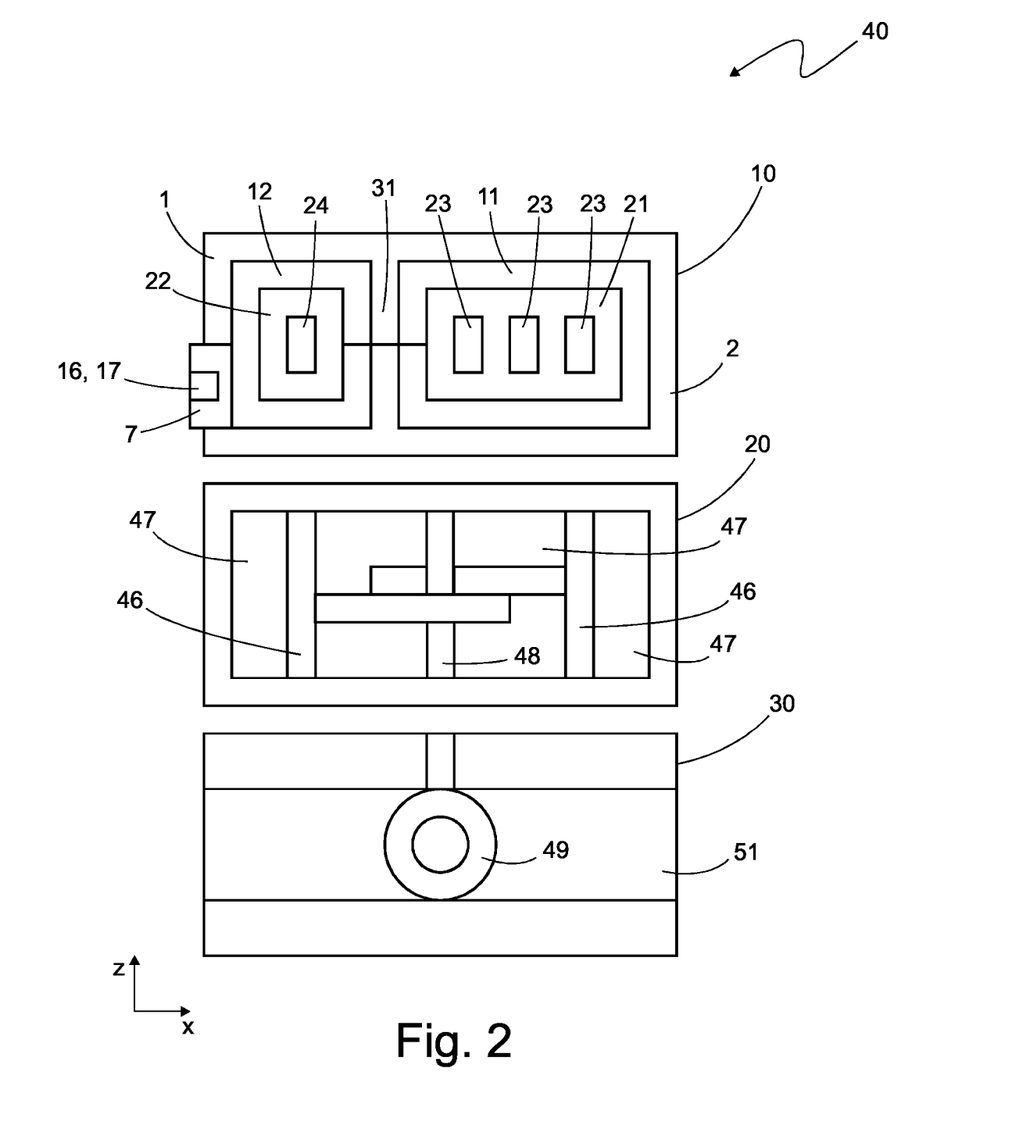
FIG. 2 shows a schematic diagram of a process valve assembly.

As shown in FIG. 2 the apparatus 10 can, for example, form a process valve assembly 40 together with the valve drive 20 and the valve fitting 30. For better visibility, the apparatus 10, valve drive 20, and valve fitting 30 are shown spaced apart in FIG. 2; tat but in reality the apparatus 10 may be mounted on the valve drive 20 and the valve drive 20 may be mounted on the valve fitting 30.

As an example, the apparatus 10 has a display 3 located on the outside of the housing 2, in particular a graphic display with which, for example, an operating status of the apparatus 10 can be displayed.

Furthermore, the apparatus 10 is expediently adapted to communicate with a (not shown) higher-level controller, for example a programmable logic controller, PLC, in order to receive commands for controlling the valve drive 20 and/or the valve fitting 30 and/or to transmit a feedback signal, for example a sensor value and/or status information, to the higher-level controller. For this purpose, the apparatus 10 comprises one or more communication circuits 25, which in particular form part of the first circuit arrangement 21.

Furthermore, the apparatus 10 is exemplarily adapted to provide control of the valve drive 20 and/or the valve fitting 30, especially by means of fluidic signals, in particular on the basis of commands received from the higher-level controller. For this purpose, the apparatus 10 is equipped with a control circuit 27, e.g. one or more microcontrollers 37, 38, in which in particular an open-loop control model and/or closed-loop control model is stored, which is adapted to the valve drive 20 and/or the valve fitting 30 and which is used for the control. The control circuit 27 is in particular part of the first circuit arrangement 21.

In addition, the apparatus 10 expediently comprises a fluid device 28, in particular one or more valves, preferably one or more pilot valves, which is controlled by the control circuit 27 and which, on the basis of this control, provides fluid signals for the valve drive 20 and/or the valve fitting 30.

The apparatus 10 has a number of external ports 16, 17, especially fluidic ports. In particular, ports 16, 17 may be located on a detachable connection element 7, which may in particular form part of the housing 2. Expediently, the ports 16, 17 serve to provide a fluidic connection to the fluid device 28. Via the ports 16, 17, the fluid device 28 can be fluidically connected, for example, to a (not shown) source of pressurized fluid and/or to one or more pressure chambers 47 of the valve drive 20. In particular, the apparatus 10 is adapted to output fluidic signals for controlling the valve drive 20 and/or the valve fitting 30 via one or more of the ports 16, 17.

For example, fluidic signals are output to one or more pressure chambers 47 of the valve drive 20 to set one or more pistons 46 of the valve drive 20 in motion, which in turn sets a drive shaft 48 in rotation. The drive shaft 48 is coupled to a valve member 49 located in a process fluid channel 51. The control performed by the apparatus 10 can thus change the position of the valve member 49 and thus influence a process fluid flowing through the process fluid channel 51.

Expediently, the drive shaft 48 is further coupled to a shaft 14 of the apparatus 10, which shaft 14 is located in the first housing inner area 11. The shaft 14 is in turn coupled with an angle of rotation measuring unit 15 and/or a position indicator 4, which is expediently located in the first housing inner area 11.

As already mentioned, the inner area enclosed by the housing 2 is divided into a first housing inner area 11 and a second housing inner area 12. The first housing inner area 11 and the second housing inner area 12 are exemplarily two non-overlapping partial volumes of a total volume enclosed by the housing 2. According to a preferred embodiment, the first housing inner area 11 and the second housing inner area 12 together represent the total inner area of the housing 2 or the apparatus 10. Preferably, the first housing inner area 11 represents more than 50% of the total inner area; and the second housing inner area 12 represents more than 20%, 30% or 40% of the total inner area.

The first housing inner area 11 is dust-tightly closed by the first wall structure section 5 against the environment of the apparatus 10 and/or against the second housing inner area 12, especially according to IP6x.

Expediently, the two housing inner areas 11, 12 are divided into multiple sub-areas 41, 42, 43, 44, 45, e.g. by the second circuit board 32 and/or the third circuit board 33. For example, the first housing inner area 11 is divided into sub-areas 41, 42, 43 and the second housing inner area 12 is divided into sub-areas 44 and 45.

The housing inner areas 11, 12 are defined by the wall structure sections 5, 6. Expediently, the wall structure sections 5, 6 are integral parts of the wall structure 1 or the apparatus 10. In particular, the wall structure sections 5, 6 are respectively not modules and are expediently not removable from each other or from the apparatus 10.

The subdivision into the two housing inner areas 11, 12 is made by means of the wall structure 1, in particular by means of wall elements 8, 9 of the wall structure 1 projecting into the inner area of the housing 2. As an example, the wall structure 1 has the wall element 8 projecting inwards in x-direction from a side wall of the housing 2 and the wall element 9 projecting upwards in z-direction from the bottom wall of the housing 2, which wall elements 8, 9 meet in the inner area of the housing 2. The wall elements 8 and 9 are expediently each designed bar-shaped. The wall element 8 is aligned with its largest surface perpendicular to the z-direction and the wall element 9 is aligned with its largest surface perpendicular to the x-direction. The wall element 8 and the wall element 9 are each part of the first wall structure section 5 and the second wall structure section 6. The wall elements 8 and 9 provide a dust-tight separation of the first housing inner area 11 from the second housing inner area 12.

As an example, part of the first wall structure section 5, in particular the wall element 8, is formed by a first circuit board 31 arranged in housing 2. Preferably the first circuit board 31 is also part of the second wall structure section 6.

The first circuit board 31 is aligned horizontally—i.e. in a y-z plane—as an example and runs expediently over the entire width of the volume enclosed by housing 2. The first circuit board 31 rests on the wall element 9 and is supported by it. As an example, the first circuit board 31 and the wall element 9 form a T-shaped structure.

The contact points between the first circuit board 31 and the side wall of the housing 2 and between the first circuit board 31 and the wall element 9 are dust-tight. The first circuit board 31 itself is also dust-tight.

The first circuit board 31 has several layers, which are in particular glued together by means of so-called prepregs—i.e. textile fiber-matrix semi-finished products pre-impregnated with resins. Furthermore, the first circuit board 31 has at least one circuit board core—i.e. two copper foils with a prepreg in between. The prepreg or the circuit board core isolates the two housing inner areas 11, 12 of the housing from each other, especially in terms of explosion protection.

In addition, the circuit board 31 may include one or two outer prepregs and/or outer circuit board cores between which electrical lines are routed. Expediently, these lines are separated by the one or two prepregs and/or circuit board cores in a dust-tight manner from the second inner area 12 and/or the first inner area 11. The electrical lines run in particular in inner layers of the first circuit board 31.

Expediently, in the first circuit board 31 an electrical line runs, which provides an electrical connection between the first circuit arrangement 21 and the second circuit arrangement 22.

In the following, the first housing inner area 11 will be discussed in more detail:

The x-z cross-section of the first housing inner area 11 corresponds to an L (rotated 180 degrees). The first wall structure section 5, which encloses the first housing inner area 11, comprises the top wall of the housing 2, a first (right) side wall of the housing 2, a section of the bottom wall of the housing 2, the wall elements 8, 9 and a section of a second (left) side wall of the housing 2. The first housing inner area 11 is dust-tightly sealed according to IP6x.

The first housing inner area 11 serves in particular to accommodate the main part of the electrics and electronics of the apparatus 10. The entire electrics and electronics housed in the first housing inner area 11 shall also be referred to as the first circuit arrangement 21.

The first circuit arrangement 21 comprises one or more communication circuits 25 for communication with an external unit, in particular the higher-level controller. The communication circuit 25 comprises, for example, one or more digital and/or analog interfaces 26, 36, in particular an analog current interface 26. Furthermore, the first circuit arrangement preferably comprises the control circuit 27. Expediently, the first circuit arrangement 21 further comprises electrical terminal clamps.

As an example, the control circuit 27, the analog current interface 26 and/or a safety barrier 35 are located on the first circuit board 31.

Expediently, a third circuit board 33, which runs parallel to the first circuit board 31 as an example, is arranged in the first housing inner area 11. On the third circuit board 33, the digital/analog interfaces 36 and/or the angle of rotation measuring unit 15 are arranged. The third circuit board 33 runs exemplarily between the wall element 9 and the first (right) side wall of the housing 2.

The various circuits of the first circuit arrangement 21 each comprise one or more electric circuits 23. The electric circuits 23 are each designed intrinsically safe, i.e. each of the electric circuits 23 fulfils, by itself, the ignition protection type intrinsically safe (Ex i). As long as no electrically conductive dust penetrates into the first housing inner area 11, the explosion safety of the first housing inner area 11 is guaranteed.

According to a possible embodiment, the first circuit arrangement 21 is not altogether intrinsically safe. For example, the first circuit arrangement 21 can be designed in such a way that potential differences between nodes of different electric circuits 23 can form an explosion-causing spark and/or an explosion-causing heating in case of dust accumulation and short circuit. Furthermore, the first circuit arrangement 21 may include one or more protective barriers 35 which could be bridged by the dust, which in turn would cancel the intrinsic safety and would allow heating and/or sparking caused by an electrical short circuit. The first circuit arrangement 21 can be designed in this way since the penetration of dust is prevented by the dust-tight first wall structure section 5. Therefore, the risk of dust penetration does not have to be considered when designing the first circuit arrangement 21.

One, several or all of the electrical/electronic functional units contained in the first housing inner area 11, in particular the first circuit arrangement 21, are not contained in the second housing inner area 12.

Now to the second housing inner area 12:

The second housing inner area 12 has an exemplarily rectangular x-z cross section. The second housing inner area 12 is enclosed by the second wall structure section 6, which exemplarily includes a section of the bottom wall of the housing 2, the wall element 9, the wall element 8, a section of the second (left) side wall of the housing 2 and the connection element 7.

The second housing inner area 12—in contrast to the first housing inner area 11—does not necessarily have to be dust-tight, especially not according to IP6x, and, as an example, is not.

The second housing inner area 12 is used in particular to accommodate the main part, preferably all, of the fluidic functional units of the apparatus 10. The fluidic functional units in the second housing inner area 12 can altogether be referred to as the fluid device 28.

The fluid device 28 expediently includes one or more valves, for example one or more pilot valves and/or a pressure amplifier or booster.

Further, an actuator device 34 and/or a sensor device 29 can be arranged in the second housing inner area 12. The actuator device 34 is, for example, an electromagnetic or electrodynamic actuator, especially a plunger coil. The sensor device 29 comprises for example a pressure sensor.

The second circuit arrangement 22 is located in the second inner area 12 of the housing 2. The second circuit arrangement 22 comprises all the electrics/electronics located in the second inner area 12 of the housing. In particular, the second circuit arrangement 22 comprises all circuits or electric circuits 24, which belong to the fluid device 28, the sensor device 29 and/or the actuator device 34.

For example, the second circuit arrangement 22 comprises a control and/or readout circuit of the actuator device 34, of the sensor device 29 and/or of the fluid device 28, for example of one or more valves, in particular pilot valves.

The control and/or readout circuit comprises in particular an analog-to-digital converter and/or a digital-to-analog converter.

For example, the second circuit arrangement 22 receives analog sensor signals from the sensor device 29, converts them into digital signals by means of the readout circuit and makes the digital signals available to the control circuit 27 in the first housing inner area 11, for example via the electrical connection running through the first circuit board 31.

Furthermore, the second circuit arrangement 22 can receive digital control signals from the control circuit 27 via the electrical connection running through the first circuit board 31, convert these signals into analog control signals by means of the control circuit (of the second circuit arrangement 2) and control the actuator device 34 with the analog control signals.

As an example, a second circuit board 32 is located in the second housing inner area 12. On the second circuit board 32, the second circuit arrangement 22, the sensor device 29 and/or the actuator device 34 is located.

The apparatus 10 has an exchangeable attachment element, in particular a connection element 7, which is part of the second wall structure section 6. The attachment element is, for example, a connection plate.

As an example, the attachment element is part of the housing 2—and thus of the outer wall of the apparatus 10. The attachment element is part of the second wall structure section 6 and separates the second housing inner area 12 from the environment of the apparatus 10. The attachment element can be detached and replaced by another attachment element. The attachment element is especially non-metallic.

Since the second housing inner area 12 does not have to be sealed dust-tight, the requirements for the attachment element are less stringent, so that it can be adapted or modified without any major effort.

As an example, the attachment element is designed as a connection element 7 and has one or more fluid ports—here the fluid ports 16 and 17. Expediently, the attachment element is fastened with a in particular detachable fastener 18, for example a screw.

One, several or all fluidic and/or electrical/electronic functional units contained in the second housing inner area 12, in particular the second circuit arrangement 22, the fluid device 28, the sensor device 29 and/or the actuator 34, are expediently not contained in the first housing inner area 11. Expediently, the first wall structure section 5 does not include the attachment element.

In the second inner area 12 of the housing, explosion safety is ensured by the second circuit arrangement 22 (which comprises all circuits 24 arranged in the second inner area 12) is designed to be altogether intrinsically safe. The "altogether intrinsically safe design" can also be referred to as "single circuit intrinsic safety". What is meant is that the second circuit arrangement 22 remains intrinsically safe even if the dusts penetrate into the second housing inner area 12. The risk of sparking or inadmissibly high heating due to electrical short circuits caused by electrically conductive dust is eliminated in this case.

This single circuit intrinsic safety can be achieved in several ways.

For example, the second circuit arrangement 22 as a whole can be designed like a single intrinsically safe circuit or consist of a single intrinsically safe circuit only.

If there is only one single (intrinsically safe) circuit, there is no possibility that penetrated dusts can establish an electrical connection between two (intrinsically safe) circuits and thus cancel the respective intrinsic safety.

Furthermore, the single-circuit intrinsic safety of the second circuit arrangement 22 can be achieved by there being no safety barrier, in particular no Zener barrier, no diode acting as a safety barrier and/or no current-limiting resistor acting as a safety barrier, in the second housing inner area 12.

If there is no safety barrier in the second housing inner area 12, then no safety barrier can be bridged by penetrating electrically conductive currents (which in turn would result in the intrinsic safety being cancelled).

At least one safety barrier 35, in particular at least one Zener barrier, is expediently arranged in the first housing inner area 11. The safety barrier 35 is electrically connected to the second circuit arrangement 22 and limits a voltage and/or a current of the second circuit arrangement 22. The electrical connection between the safety barrier 35 and the second circuit arrangement 22 expediently runs through the first circuit board 31.

Furthermore, the single-circuit intrinsic safety can be achieved by the second circuit arrangement 22 being designed in such a way that, during specified normal operation of the second circuit arrangement 22, the maximum potential difference occurring between two nodes of the second circuit arrangement 22 is below a predetermined threshold value, so that even in the event of a short circuit between two nodes of the second circuit arrangement caused by penetrating dust, no explosion-causing sparking and/or explosion-causing heating, for example by a glow nest, occurs.

Preferably all possible potential differences between all possible combinations of nodes are below the threshold.

According to a possible embodiment, the second circuit arrangement 22 is not designed to be altogether intrinsically safe. According to another possible embodiment, there is no second circuit arrangement 22 in the second housing inner area 12.

In the following, further aspects and advantages of the apparatus 10, in particular compared to the prior art, will be discussed in more detail.

The prior art is that an explosion-proof apparatus or its housing as well as all attachments that are part of the housing, and thus contribute to the tightness of the housing, are subject to the requirements of the ignition protection type (Ex t) if multiple intrinsically safe circuits are present in the housing and the apparatus is to comply with specific standards for operation in areas with electrically conductive flammable dusts, e.g. IEC/EN 60079-31 and IEC/EN 60079-0.

Apparatuses in process automation are often designed for areas where there is a risk of explosion, e.g. according to the ATEX directives and/or IECEx.

Areas where there is a risk of explosion are e.g. areas where flammable gases or flammable dusts occur.

The environments (zones) for flammable gases or flammable dusts are defined separately; they usually do not occur together. Nevertheless, apparatuses are usually designed for both zones simultaneously in order to keep the number of different designs low. Since both areas must be considered, the design of such apparatuses can be very complex. In addition, an apparatus designed as positioner and/or control head includes fluidic, especially pneumatic, as well as electrical functional units.

Typically, such apparatuses are designed with the ignition protection type "protection by housing" (Ex t). Such apparatuses often have several circuits (e.g. supply lines with several control circuits, in particular communication and/or control circuits), which are each designed intrinsically safe (Ex i), but where it is possible that in the presence of electrically conductive dust (e.g. Zone 20; Zone 21) an electrical short circuit between two intrinsically safe circuits may occur, which in turn may cause sparks and/or heating.

For this reason, a defined housing protection type (e.g. IP6x according to IEC/EN 60529) is usually mandatory for such apparatus.

A dust-tight design of the housing involves a lot of effort, in particular in the presence of non-metallic housing parts (e.g. seals). To verify the dust-tightness, extensive tests are required under, for example, extended temperature requirements, ageing through storage, UV light tests, impact tests, etc. It is particularly problematic that these extensive tests are also required for modifications to an already verified housing and must be verified by a designated body (approval authority).

This considerably limits changes, especially in the fluidic functional units of the apparatus. Those fluidic functional units that form part of the housing must also be dust-tight so that the housing is dust-tight overall. A high degree of flexibility is often desired for these fluidic functional units in particular. For example, the possibility of changing or replacing an attachment element mounted on the outside with another one is desired. Furthermore, it may be desired to change the material of an attachment element that forms part of the housing, for example of a pressure amplifier housing and/or of a cassette for pneumatic functions. However, to ensure a dust-tight design, all such modifications would require the extensive testing described above, especially if non-metallic parts of the housing are involved.

Furthermore, it is usually necessary to provide electrical functional units with the pneumatic functional units; for example, circuits for controlling pilot valves and/or pressure sensors.

From the point of view of explosion protection, the housing 2 is divided into two parts: a first housing part with the first housing inner area 11 and a second housing part with the second housing inner area 12.

The first part of the housing is subject to the requirements of "protection by housing" and the second part is not.

This is achieved by a defined separation of the two housing parts. This is achieved in particular by means of the first circuit board 31, which can also be described as the main circuit board. A part of this first circuit board makes the partition wall. Furthermore, a part of the first circuit board 31 can also serve as a line feed-through, especially in its inner layers. The upper and lower prepregs or cores of the circuit board 31 then serve as insulation between the housing parts/walls for explosion protection purposes.

The electric circuits (an electric circuit from the explosion protection point of view), which run from the first part of the housing into the second part of the housing, are fed through in the inner layers of the circuit board 31. These fed-through circuits can tolerate a dust accumulation by penetration of electrically conductive dust into the housing 2 without endangering safety. This "one" circuit is then designed intrinsically safe for dust and gas from the point of view of explosion protection and remains so even with the aforementioned dust accumulation.

In the first part of the housing there is a (not shown) connection space, for example with electrical terminals. Furthermore, the first part of the housing contains the main part of the electronics, preferably more than 90% of the electronic components of the apparatus.

In the first part of the housing, the protection types intrinsic safety (Ex i), encapsulation (Ex i) and/or protection by housing (Ex t) are expediently used. Expediently, the first housing part meets the requirements for non-metallic housing parts in terms of explosion protection (Ex t) and the requirements for shock resistance, for example according to IEC 60079-0 and/or IEC 600079-31.

In the second part of the housing, especially pneumatics, for example pilot valves and/or boosters, are located. Furthermore, one or more pressure sensors and/or a displacement measuring unit, for example a potentiometer, can be arranged in the second part of the housing.

For the second part of the housing, in particular the protection type that intrinsic safety (Ex i) for gas and dust is fulfilled even when dust is deposited, is used.

For the second part of the housing there are expediently no increased requirements for non-metallic housing parts due to intrinsic safety for dust (Ex i). Furthermore, there are no increased requirements for shock resistance and/or UV resistance of the plastics.

In summary, this results in an electrical apparatus 10 for the area where there is a risk of explosion with combustible and/or conductive dusts, the apparatus 10 having a housing 2, which is divided into at least two parts. For the division, expediently the first circuit board 31 is used, which can also be used to feed circuits from the first part of the housing into the second part. The circuit board is part of the electronics. The first part of the housing is preferably subject to the more stringent requirements of IEC/EN 60079-31 in the protection type "protection by housing" (Ex t), whereas these requirements expediently do not apply to the second part of the housing.

The second housing part B is expediently only subject to the normal functional requirements of the housing without consideration of the special requirements for non-metallic housing parts.

Expediently, only one circuit between the first housing part and the second housing part is designed intrinsically safe in terms of explosion protection for gas and dust.

For example, an intrinsically safe circuit can be defined according to the DIN/EN/IEC 60079-11 standard. Preferably, an intrinsically safe circuit can be designed in such a way that no ignition sparks (opening and closing sparks) and no impermissibly high heating according to the temperature class can occur. Expediently, an intrinsically safe circuit is limited in its maximum voltage, the maximum possible current, the maximum possible output power, its effective electrical storage, its internal effective capacity and its internal effective inductance.

For example, a single-circuit intrinsically safe circuit arrangement contains only components that are not directly responsible for intrinsic safety. Preferably, none of the components of a single circuit intrinsically safe circuit arrangement has an active and/or designated safety-relevant function.

Furthermore, a single-circuit intrinsically safe circuit arrangement preferably does not include any electrical energy storage components such as capacitors or inductors, which would require additional protective elements also present in the circuit to achieve intrinsic safety. The single-circuit intrinsically safe circuit arrangement does not include such protective elements, in particular resistors that limit the maximum discharge current of capacitors and/or clamping diodes (e.g. Zener diodes) that limit the counter-induction and thus voltage increases at an inductor.

Finally, a single-circuit intrinsically safe circuit arrangement is expediently designed in such a way that any circuit node of the single-circuit intrinsically safe circuit arrangement can be connected to any other circuit node of the same single-circuit intrinsically safe circuit arrangement without impairing the intrinsic safety and/or the explosion protection of the single-circuit intrinsically safe circuit arrangement.

The invention claimed is:

1. An apparatus, for process automation for use in an area in which there is a risk of explosion and in which dust occurs, the apparatus comprising:
    a wall structure serving as a housing of the apparatus and comprising a first wall structure section defining a first housing inner area and a second wall structure section defining a second housing inner area separate from the first housing inner area,
    wherein a first circuit arrangement is arranged in the first housing inner area and the first housing inner area is enclosed in a dust-tight manner by the first wall structure section so that the dust cannot penetrate into the first housing inner area and explosion protection of the first housing inner area is ensured by the dust-tight enclosure, and
    wherein one or more electric circuits are arranged in the second housing inner area and all of the one or more electric circuits arranged in the second inner area form an altogether intrinsically safe second circuit arrangement, so that dust penetrating into the second housing inner area cannot cause explosion-initiating heating and/or spark formation by the second circuit arrangement and explosion protection of the second housing inner area is ensured by the altogether intrinsically safe second circuit arrangement, and
    wherein the apparatus further comprises an exchangeable attachment element, the exchangeable attachment element being part of the second wall structure section, wherein the exchangeable attachment element comprises one or more fluid ports.

2. The apparatus according to claim 1, wherein the second circuit arrangement does not comprise a safety barrier.

3. The apparatus according to claim 1 wherein, in the first housing inner area at least one safety barrier is arranged, which is electrically connected to the second circuit arrangement and limits a voltage and/or a current and/or an electrical power of the second circuit arrangement.

4. The apparatus according to claim 1, wherein the second circuit arrangement keeps, during specified normal operation of the second circuit arrangement, a maximum potential difference occurring between two nodes of the second circuit arrangement is-below a predetermined threshold value, so that, even in the event of a short circuit between two nodes of the second circuit arrangement caused by penetrating dust, no explosion-initiating heating and/or spark formation occurs.

5. The apparatus according to claim 1, wherein the first housing inner area is designed and/or certified and/or subject to certification in accordance with protection class IP6X according to IEC/EN 60529.

6. The apparatus according to claim 1, wherein the second housing inner area is not designed and/or not certified and/or not subject to certification in accordance with protection class IP6X according to IEC/EN 60529.

7. The apparatus according to claim 1, wherein the first circuit arrangement comprises one or more communication circuits for communication with an external unit, an analog current interface, one or more digital and/or analog interfaces and/or a control circuit.

8. The apparatus according to claim 1, wherein a fluid device, an actuator device and/or a sensor device is arranged in the second housing inner area.

9. The apparatus according to claim 1, wherein the second circuit arrangement comprises a control and/or read-out circuit of a fluid device, and/or of a sensor device, and/or of an actuator device.

10. A process valve assembly comprising an apparatus that is a control head and/or positioner according to claim 1, a valve drive on which the apparatus is mounted and which is controlled by the apparatus, and a valve fitting which can be actuated by the valve drive to influence a process fluid.

11. The apparatus according to claim 1, wherein the apparatus is a control head, a positioner and/or a sensor controller.

12. The apparatus according to claim 1, wherein the exchangeable attachment element is arranged in a wall of the second wall structure section.

13. The apparatus according to claim 1, wherein the second circuit arrangement comprises an analog-to-digital converter and/or a digital-to-analog converter.

14. The apparatus according to claim 1, further comprising a first circuit board forming part of the first wall structure section.

15. The apparatus according to claim 14, wherein the first circuit board electrically connects the first circuit arrangement to the second circuit arrangement.

16. The apparatus according to claim 14, wherein the first circuit board is part of the second wall structure section.

17. The apparatus according to claim 16, wherein the first circuit board separates the first housing inner area from the second housing inner area in a dust-tight manner.

18. An apparatus, for process automation for use in an area in which there is a risk of explosion and in which dust occurs, the apparatus comprising:
- a wall structure serving as a housing of the apparatus and comprising a first wall structure section defining a first housing inner area and a second wall structure section defining a second housing inner area separate from the first housing inner area,
- wherein a first circuit arrangement is arranged in the first housing inner area and the first housing inner area is enclosed in a dust-tight manner by the first wall structure section so that the dust cannot penetrate into the first housing inner area and explosion protection of the first housing inner area is ensured by the dust-tight enclosure, and
- wherein the apparatus has a first circuit board which is part of the first wall structure section and the second wall structure section and separates the first housing inner area from the second housing inner area in a dust-tight manner, and
- wherein the first circuit board has a first surface area limiting the first housing inner area and a second surface area directly opposite to the first surface area and limiting the second housing inner area.

* * * * *